United States Patent
Chan et al.

(10) Patent No.: US 8,229,367 B2
(45) Date of Patent: Jul. 24, 2012

(54) LOW NOISE AMPLIFIER WITH COMBINED INPUT MATCHING, BALUN, AND TRANSMIT/RECEIVE SWITCH

(75) Inventors: Ngar Loong Alan Chan, San Jose, CA (US); Byung Wook Min, Santa Clara, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 591 days.

(21) Appl. No.: 12/423,645

(22) Filed: Apr. 14, 2009

(65) Prior Publication Data

US 2010/0259319 A1     Oct. 14, 2010

(51) Int. Cl.
*H04B 1/44* (2006.01)
(52) U.S. Cl. .......... 455/78; 455/311; 327/563; 330/301; 330/116; 330/117
(58) Field of Classification Search .......... 327/563; 330/116, 117, 301; 455/78, 311
See application file for complete search history.

(56) References Cited

U.S. PATENT DOCUMENTS

| | | | | |
|---|---|---|---|---|
| 6,009,314 | A * | 12/1999 | Bjork et al. | 455/83 |
| 6,735,418 | B1 * | 5/2004 | MacNally et al. | 455/78 |
| 6,809,581 | B2 * | 10/2004 | Rofougaran et al. | 327/563 |
| 6,980,776 | B2 * | 12/2005 | Shimada et al. | 455/83 |
| 7,205,844 | B2 * | 4/2007 | Su et al. | 330/301 |
| 7,209,727 | B2 * | 4/2007 | Castaneda et al. | 455/341 |
| 7,218,909 | B2 * | 5/2007 | Rofougaran et al. | 455/333 |
| 7,283,793 | B1 * | 10/2007 | McKay | 455/83 |
| 7,688,146 | B2 * | 3/2010 | Kao et al. | 330/301 |
| 2008/0139158 | A1 * | 6/2008 | Chang et al. | 455/311 |
| 2009/0039977 | A1 | 2/2009 | Lee et al. | |
| 2009/0045885 | A1 | 2/2009 | Sarfaraz | |
| 2011/0064005 | A1 * | 3/2011 | Mikhemar et al. | 370/278 |
| 2011/0098009 | A1 * | 4/2011 | Marholev et al. | 455/78 |

FOREIGN PATENT DOCUMENTS

JP     6276045     9/1994

OTHER PUBLICATIONS

Kidwai et al., "An Ultra-Low Insertion Loss T/R Switch fully integrated with 802.11b/g/n Transceiver in 90nm CMOS", Journal of Solid-State Circuits, IEEE; vol. 44, Issue 5, May 2009 pp. 1352-1360.

(Continued)

*Primary Examiner* — Lincoln Donovan
*Assistant Examiner* — William Hernandez
(74) *Attorney, Agent, or Firm* — Ramin Mobarhan

(57) ABSTRACT

A low noise amplifier (LNA) with combined input matching, balun, and/or transmit/receive (T/R) switch is described. In one exemplary design, an apparatus includes a coupled inductor and an LNA. The coupled inductor receives a single-ended input signal, performs single-ended to differential conversion, and provides a differential input signal. The LNA receives and amplifies the differential input signal and provides a differential output signal. The coupled inductor includes magnetically coupled first and second coils. The first coil provides input impedance matching when the LNA is enabled. A resonator circuit formed with the first coil provides high input impedance when the LNA is disabled. A tuning capacitor coupled to the second coil provides amplitude imbalance tuning for the differential input signal. A transmit switch is coupled between the first coil and a transmitter.

24 Claims, 9 Drawing Sheets

OTHER PUBLICATIONS

Rajashekharaiah et al., "A compact 5.6 GHz low noise amplifier with new on-chip gain controllable active balun", 2004 IEEE Workshop on Microelectronics and Electron Devices, 2004 pp. 131-132.

M.Kumarasamy Raja et al., "A Fully Integrated Variable Gain 5.75-GHz LNA with on chip Active Balun for WLAN", Radio Frequency Integrated Circuits (RFIC) Symposium, 2003 IEEE Jun. 8-10, 2003 pp. 439-442.

Chee Chong Lim et al: "Fully Symmetrical Monolithic Transformer (True la :a 1) for Silicon RFIC" IEEE Transactions on Microwave Theory and Techniques, IEEE Service Center, Piscataway, NJ, US LNKDDOI: 10.1109/TMTT.2008.2003531, vol. 56, No. 10, Oct. 1, 2008, pp. 2301-2311, XP011235155 ISSN: 0018-9480 the whole document.

De Matos M et al: A 0.25 /spl mu/m SiGe receiver front-end for 5GHz applications Microwave and Optoelectronics, 2005 SBMO/I EEE MTT-s International Conf erence on Jul. 2005, Piscataway, NJ, USA,IEEE, Jul. 20, 2005, pp. 213-217, XP010885195 ISBN: 978-0-7803-9341-7 figure 1.

Ertan Zencir et al: "UHF RF Front-End Circuits in 0.35-[mulm Silicon on Insulator (SOI) CMOS" Analog Integrated Circuits and Signal Processing, Kluwer Academic Publishers, BO LNKD- DOI : 10/1007/S10470-005-4953-Z, vol 45, No. 3, Dec. 1, 2005, pp. 231-245, XP0190204075 ISSN: 1573-1979 figures 13, 20.

International Search Report and Written Opinion—PCT/US2010/031107, International Search Authority—European Patent Office—Jun. 10, 2010.

Partial International Search Report—PCT/US2010/031107—International Search Authority, European Patent Office, Jul. 1, 2010.

* cited by examiner

US 8,229,367 B2

LOW NOISE AMPLIFIER WITH COMBINED INPUT MATCHING, BALUN, AND TRANSMIT/RECEIVE SWITCH

BACKGROUND

I. Field

The present disclosure relates generally to electronics, and more specifically to an amplifier.

II. Background

Amplifiers are commonly used in various electronics devices to provide signal amplification. Different types of amplifiers are available for different uses. For example, a wireless communication device such as a cellular phone may include a transmitter and a receiver for bi-directional communication. The receiver may utilize a low noise amplifier (LNA), the transmitter may utilize a power amplifier (PA), and the receiver and transmitter may utilize variable gain amplifiers (VGAs).

A receiver may include an LNA coupled to an antenna via various front-end circuit blocks. These circuit blocks may perform various functions such as filtering, switching between the transmitter and the receiver, impedance matching, etc. These circuit blocks may be implemented with discrete components external to an integrated circuit (IC) containing the LNA and may then increase the cost and size of the receiver. Each of these circuit blocks may also have insertion loss, which may degrade the noise figure (NF) of the receiver and hence degrade the performance of the receiver.

DETAILED DESCRIPTION

The word "exemplary" is used herein to mean "serving as an example, instance, or illustration." Any design described herein as "exemplary" is not necessarily to be construed as preferred or advantageous over other designs.

Various exemplary designs of an LNA with combined input matching, balun, and/or transmit/receive (T/R) switch are described herein. The LNA may be used for various electronics devices such as wireless and wireline communication devices, cellular phones, personal digital assistants (PDAs), handheld devices, wireless modems, laptop computers, cordless phones, Bluetooth devices, broadcast receivers, etc. The use of the LNA for a wireless communication device is described below.

Figure 1:
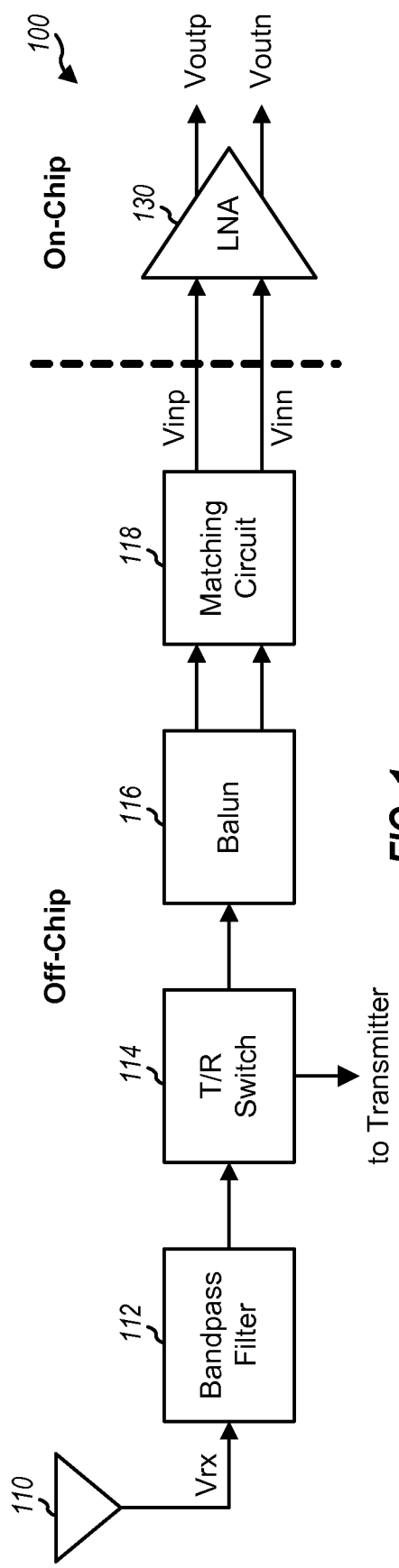
FIG. 1 shows a wireless device with off-chip front-end circuit blocks.

FIG. 1 shows a block diagram of a wireless communication device 100, which may be a cellular phone or some other device. Wireless device 100 includes a transmitter and a receiver. For simplicity, only a portion of the receiver is shown in FIG. 1, and the transmitter is not shown in FIG. 1.

In the receive path, an antenna 110 receives signals transmitted by base stations and/or other transmitter stations and provides a received radio frequency (RF) signal, Vrx. A bandpass filter 112 filters the received RF signal to remove out-of-band noise and undesired signals and provides a filtered RF signal. A T/R switch 114 connects the receiver or the transmitter to antenna 110 at any given moment. In a receive mode, the receiver is selected, and T/R switch 114 routes the filtered RF signal from bandpass filter 112 to a balun 116. In a transmit node, the transmitter is selected, and T/R switch 114 receives a transmit RF signal from the transmitter and routes the transmit RF signal to bandpass filter 112 for transmission via antenna 110.

Balun 116 performs single-ended to differential conversion. Balun 116 receives a single-ended RF signal from bandpass filter 112 via T/R switch 114 and provides a differential RF signal to a matching circuit 118. Matching circuit 118 performs input impedance matching for an LNA 130 and provides a differential input RF signal comprising a non-inverting input RF signal, Vinp, and an inverting input RF signal, Vinn. Matching circuit 118 may be implemented with inductors, capacitors, etc. LNA 130 amplifies the differential input RF signal and provides a differential output RF signal comprising a non-inverting output RF signal, Voutp, and an inverting output RF signal, Voutn.

FIG. 1 shows an exemplary design of a front-end of wireless communication device 100. In general, a received RF signal from an antenna may be routed through and conditioned by any number of circuit blocks prior to an LNA. These circuit blocks may include different and/or additional circuit blocks not shown in FIG. 1.

As shown in FIG. 1, LNA 130 may be implemented on-chip within an integrated circuit (IC), which may be an analog IC, an RF IC (RFIC), a mixed signal IC, etc. Bandpass filter 112, T/R switch 114, balun 116, and matching circuit 118 may be implemented off-chip and external to the IC. Some or all of these circuit blocks (e.g., T/R switch 114 and balun 116) may be implemented with external discrete components, which may then increase the cost and size of wireless device 100.

T/R switch 114, balun 116, and matching circuit 118 may be coupled in cascade, as shown in FIG. 1. These circuit blocks may be implemented with passive circuits. Each of these circuit blocks may then have some insertion loss, which may then degrade the noise figure of the receiver. For example, T/R switch 114 may have 1 decibel (dB) of insertion loss, and balun 116 may also have 1 dB of insertion loss. The minimum noise figure of the receiver would then be 2 dB. In general, each dB of insertion loss in T/R switch 114, balun 116, and matching circuit 118 may translate to a corresponding dB of degradation in the receiver noise figure. LNA 130 may be implemented with complementary metal oxide semiconductor (CMOS) technology and may be able to achieve a noise figure of about 1.5 dB. The receiver noise figure would then be degraded to about 3.5 dB due to the 2 dB of insertion loss of T/R switch 114 and balun 116. High-performance balun and/or T/R switch may be used in order to reduce the amount of insertion loss but would be more expensive and would increase the cost of wireless device 100. Furthermore, T/R switch 114 may degrade linearity of the receiver.

Figure 2:
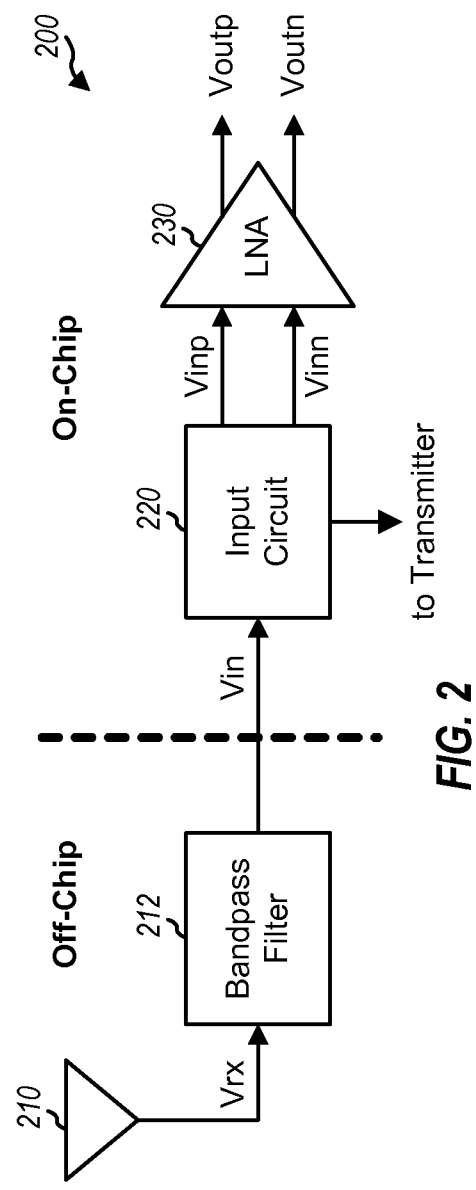
FIG. 2 shows a wireless device with on-chip front-end circuit blocks.

FIG. 2 shows a block diagram of an exemplary design of a wireless device 200 with front-end circuit blocks integrated on an IC. Wireless device 200 includes a transmitter and a receiver. Only a portion of the receiver is shown in FIG. 2, and the transmitter is not shown in FIG. 2.

In the receive path, an antenna 210 receives signals transmitted by base stations and/or other transmitter stations and provides a received RF signal. A bandpass filter 212 filters the received RF signal and provides a single-ended input RF signal, Vin, to an input circuit 220. Input circuit 220 receives the single-ended input RF signal and provides a differential input RF signal, Vinp and Vinn, to an LNA 230. Input circuit 220 may perform various functions such as input impedance matching, single-ended to differential conversion, etc. Input circuit 220 also couples either the receiver or the transmitter to bandpass filter 212 at any given moment. LNA 230 amplifies the differential input RF signal and provides a differential output RF signal, Voutp and Voutn, in the receive mode.

Input circuit 220 and LNA 230 may be implemented on-chip within an IC, which may be an analog IC, an RFIC, a mixed signal IC, etc. Bandpass filter 212 may be implemented off-chip and external to the IC.

In the exemplary design shown in FIG. 2, a T/R switch, a balun, and a matching circuit may be combined in a single circuit block, which is input circuit 220. Input circuit 220 may have lower insertion loss than the cascade of T/R switch 114, balun 116, and matching circuit 118 in FIG. 1 for equivalent functions. An LNA with combined input matching, balun, and T/R switch (e.g., as shown in FIG. 2) may be able to achieve lower noise figure and higher linearity than an LNA with cascaded input matching, balun, and T/R switch (e.g., as shown in FIG. 1). Furthermore, the LNA with combined input matching, balun, and T/R switch may be lower cost and may occupy less overall area.

Input circuit 220 and LNA 230 may be implemented in various manners. Several exemplary designs of input circuit 220 and LNA 230 are described below.

Figure 3:
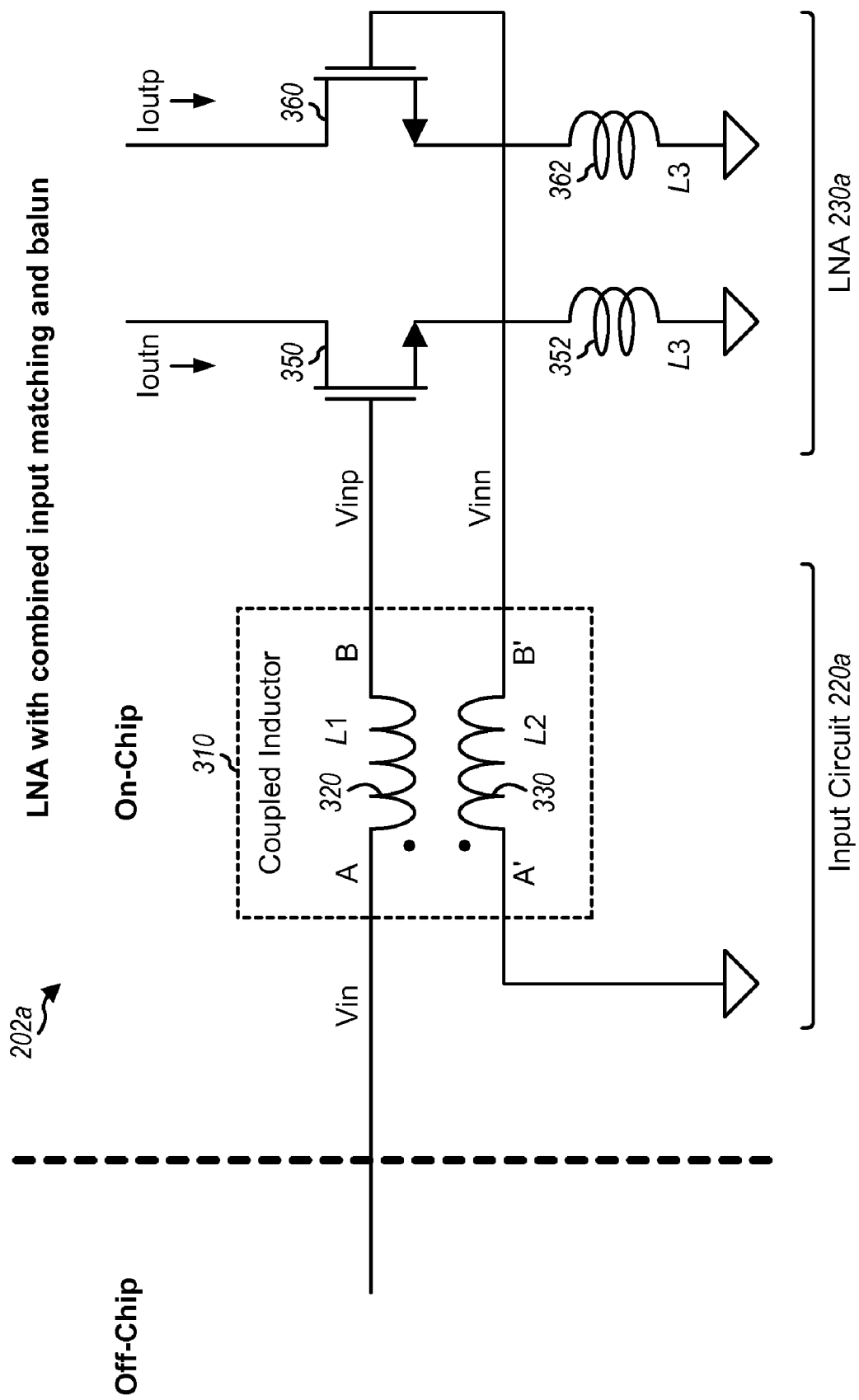
FIGS. 3 to 7 show several exemplary designs of an input circuit and an LNA.

FIG. 3 shows a schematic diagram of an exemplary design of a front-end 202a comprising an LNA with combined input matching and balun. Front-end 202a comprises an input circuit 220a and an LNA 230a, which are an exemplary design of input circuit 220 and LNA 230, respectively, in FIG. 2. Input circuit 220a receives the single-ended input RF signal, Vin, and provides the differential input RF signal, Vinp and Vinn. LNA 230a amplifies the differential input RF signal and provides a differential output current signal, Ioutp and Ioutn.

In the exemplary design shown in FIG. 3, input circuit 220a comprises a coupled inductor 310 having a first coil 320 magnetically coupled with a second coil 330. A coupled inductor is a circuit having at least two coils magnetically coupled together. A coil may also be referred to as a conductor, an inductor, a wire, a winding, etc. Coil 320 has one end (labeled as node A) receiving the Vin signal and the other end (labeled as node B) providing the Vinp signal. Coil 330 has one end (labeled as node A') coupled to circuit ground and the other end (labeled as node B') providing the Vinn signal.

In the exemplary design shown in FIG. 3, LNA 230 includes N-channel metal oxide semiconductor (NMOS) transistors 350 and 360 and inductors 352 and 362. NMOS transistor 350 has its gate receiving the Vinp signal, its source coupled to one end of inductor 352, and its drain providing the Ioutn signal. NMOS transistor 360 has its gate receiving the Vinn signal, its source coupled to one end of inductor 362, and its drain providing the Ioutp signal. The other ends of inductors 352 and 362 are coupled to circuit ground.

Inductors 352 and 362 are source degeneration inductors used for a narrowband design of LNA 230a. Coils 320 and 330 and inductors 352 and 362 are used for input impedance matching. These coils and inductors may be implemented on-chip and may then have relatively low quality factor (Q). Coils 320 and 330 may be magnetic coupled to improve the Q of these coils. The total inductance of coils 320 and 330, with magnetic coupling, may be expressed as:

$$L_{total} = L_1 + L_2 + M, \text{ and} \quad \text{Eq(1)}$$

$$M = k \cdot \sqrt{L_1 L_2}, \quad \text{Eq(2)}$$

where $L_1$ and $L_2$ are the inductances of coils 320 and 330, respectively,

M is the mutual inductance of coils 320 and 330, k is a coupling coefficient, and $L_{total}$ is the total inductance of coupled inductor 310.

The coupling coefficient k may be dependent on the amount of magnetic coupling between coils 320 and 330. The coupling coefficient may be less than 1.0 in general and within a range of 0.4 to 0.7 typically. A larger coupling coefficient may be obtained with more turns for coils 320 and 330 to increase the magnetic coupling. A given $L_{total}$ may be obtained with smaller $L_1$ and $L_2$ by magnetically coupling coils 320 and 330. The smaller $L_1$ and $L_2$ may be obtained with shorter length coils, which may then result in smaller series resistance and hence higher Q for the coils. In an ideal case with k=1, the inductance of each coil may be reduced by about one half, the series resistance may also be reduced by about one half, and the Q may be doubled. In general, the amount of improvement in Q may be dependent on the value of k.

In the exemplary design shown in FIG. 3, a singled-ended input for input circuit 220a may be obtained by simply grounding node A' of coil 330. The coupled inductor may thus allow input circuit 220a to easily implement a balun. For an LNA with a differential input signal, noise from a power supply or a substrate coupled to the LNA may be amplified in a common mode, and the differential output signal from the LNA may have little (or ideally, no) common mode noise. The balun and the input traces of input circuit 220a may be shielded to reduce noise coupling to LNA 230a.

Figure 4:
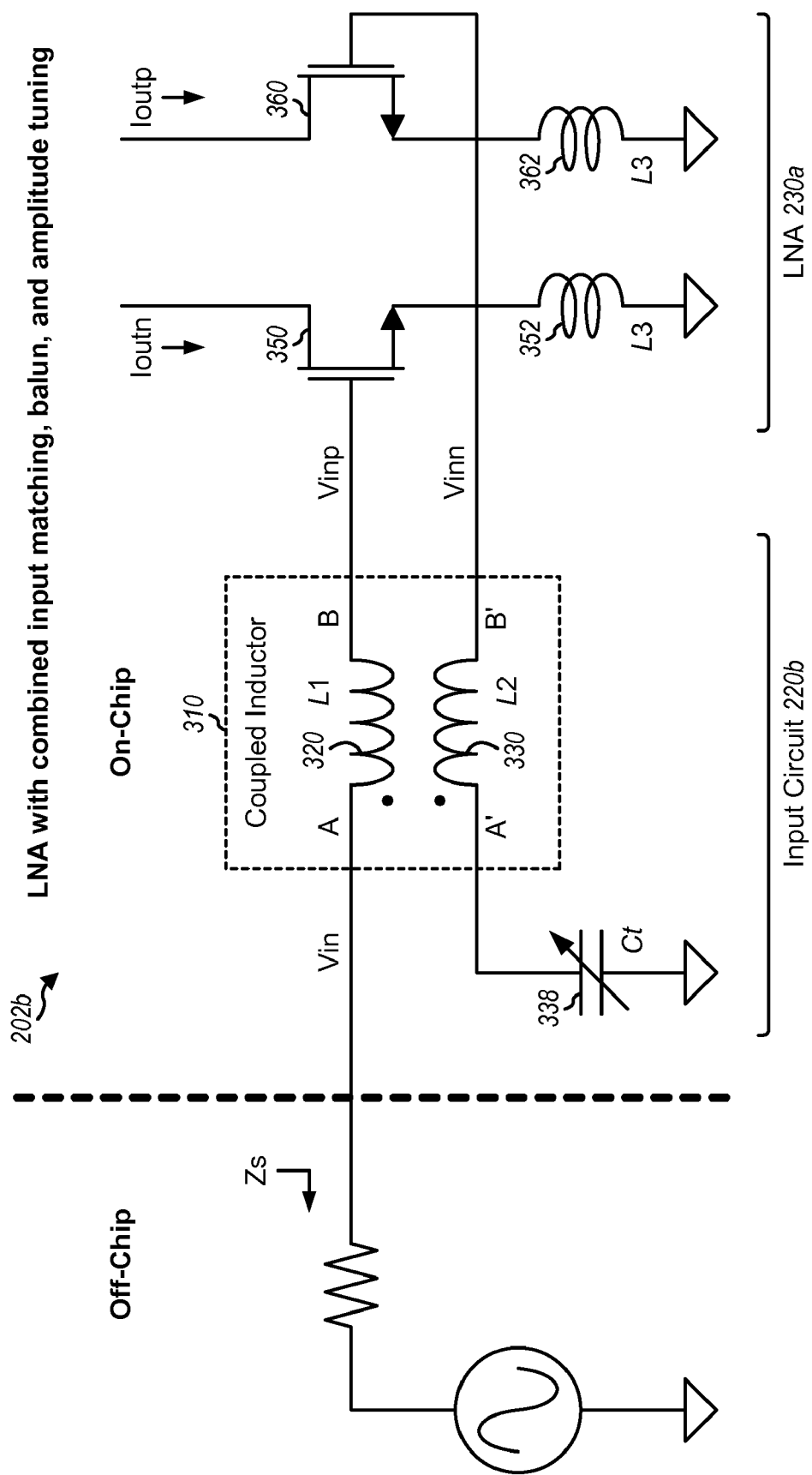

FIG. 4 shows a schematic diagram of an exemplary design of a front-end 202b comprising an LNA with combined input matching, balun, and amplitude balance tuning. Front-end 202b comprises an input circuit 220b, which is another exemplary design of input circuit 220 in FIG. 2, and LNA 230a. Input circuit 220b comprises coupled inductor 310 and a tuning capacitor 338. Coupled inductor 310 and LNA 230a are coupled as described above for FIG. 3. Tuning capacitor 338 has one end coupled to node A' of coil 330 and the other end coupled to circuit ground.

Grounding node A' of coil 330, as shown in FIG. 3, and driving node A of coil 320 with a signal source may create amplitude imbalance between the Vinp and Vinn signals. The signal source may have an output impedance of Zs Ohm, where Zs may be 50 Ohm or some other value. A resistor of Zs Ohm may be added between node A' of coil 330 and circuit ground. This resistor may reduce amplitude imbalance but may introduce noise to LNA 230a.

In the exemplary design shown in FIG. 4, tuning capacitor 338 is coupled between node A' of coil 330 and circuit ground. In one exemplary design, tuning capacitor 338 is implemented with a bank of selectable capacitors. Each selectable capacitor may be enabled/selected to increase the capacitance of tuning capacitor 338 or disabled/deselected to reduce the capacitance. The bank may include a sufficient number of selectable capacitors of suitable values to obtain the desired tuning range for capacitor 338. In another exemplary design, tuning capacitor 338 is implemented with at least one varactor having variable capacitance determined based on a control voltage. In yet another exemplary design, tuning capacitor 338 is implemented with at least one capacitor having a fixed value.

For simplicity, FIG. 4 shows tuning capacitor 338 being coupled directly to circuit ground. In practice, tuning capacitor 338 may be coupled to a bond wire or a package routing trace on an IC. A parasitic inductor may then be present between tuning capacitor 338 and circuit ground. This parasitic inductor may be accounted for by tuning the value of capacitor 338. Capacitor 338 may be tuned to match the input impedance at node A' with the input impedance at node A at the operating frequency of LNA 230a, instead of broadband. The tuning may be achieved by adjusting the value of capacitor 338 and measuring a performance metric (e.g., the receiver noise figure) for each capacitor value. Capacitor 338 may then be set to the value that provides the best performance metric. The use of capacitor 338 (instead of a resistor) at node A' of coil 330 may balance the amplitude of the Vinp and Vinn signals while reducing noise degradation.

Figure 5:
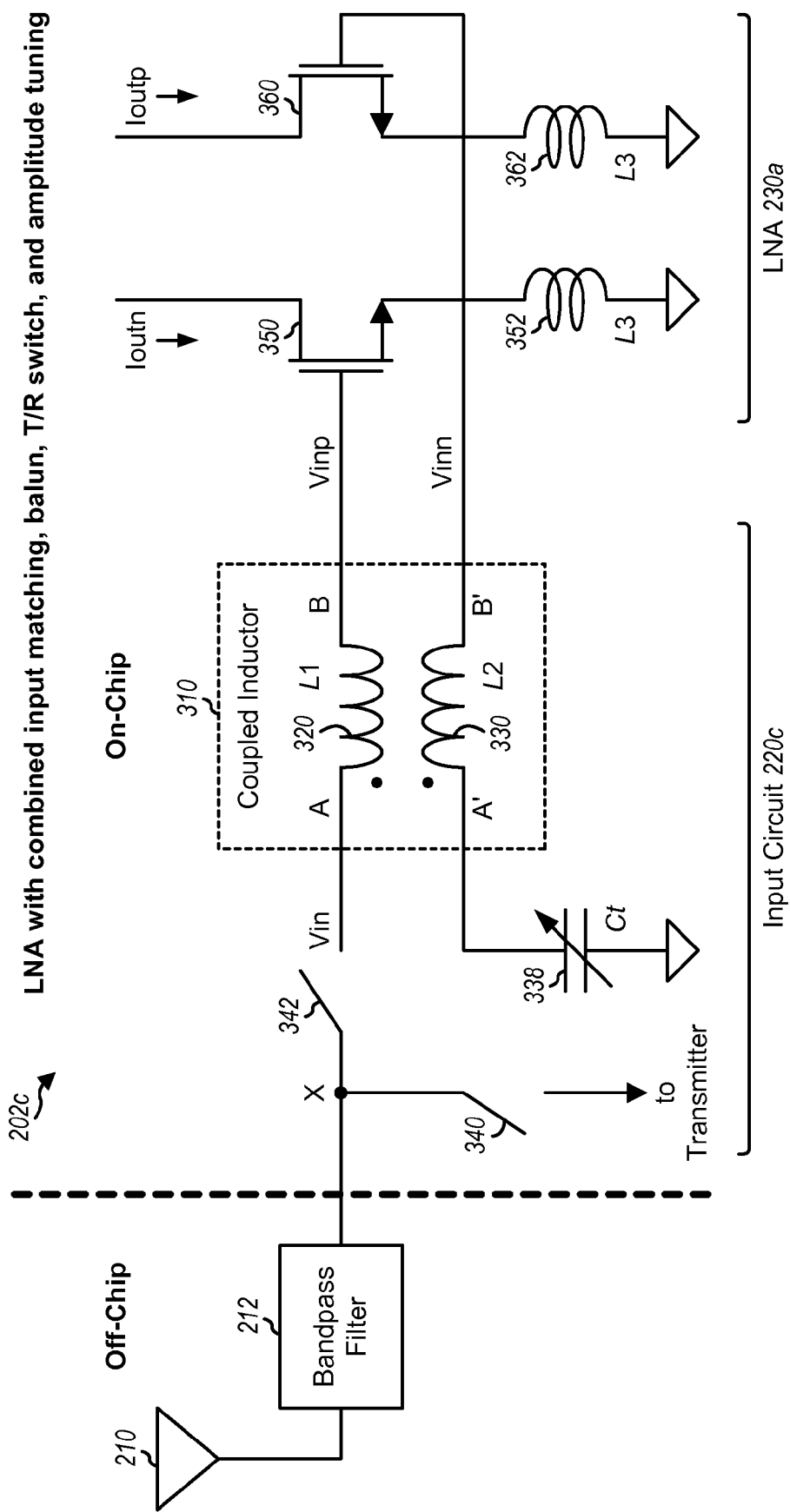

FIG. 5 shows a schematic diagram of an exemplary design of a front-end 202c comprising an LNA with combined input matching, balun, T/R switch, and amplitude balance tuning. Front-end 202c comprises an input circuit 220c, which is another exemplary design of input circuit 220 in FIG. 2, and LNA 230a. Input circuit 220c comprises coupled inductor 310 and tuning capacitor 338, which are coupled as described above for FIG. 4. Input circuit 220c further comprises a T/R switch implemented with a transmit (TX) switch 340 and a receive (RX) switch 342. Switch 340 has one end coupled to node X and the other end coupled to the transmitter (not shown in FIG. 5). Switch 342 has one end coupled to node X and the other end coupled to node A of coil 320. Node X may correspond to an IC pad or pin.

Front-end 202c may operate in the transmit mode or the receive mode at any given moment. In the transmit mode, TX switch 340 is closed, and RX switch 342 is opened. The transmitter is then coupled via switch 340 and bandpass filter 212 to antenna 210. In the receive mode, TX switch 340 is opened, and RX switch 342 is closed. The transmitter is then decoupled from node X by switch 340. The received RF signal from antenna 210 is provided via bandpass filter 212 and switch 342 to node A of coil 320.

TX switch 340 may be designed to handle a large amplitude for the transmit RF signal from the transmitter and to have low insertion loss when turned on. RX switch 342 may also be designed to handle the large transmit RF signal from the transmitter in the transmit mode and to have low insertion loss in the receive mode.

Figure 6:
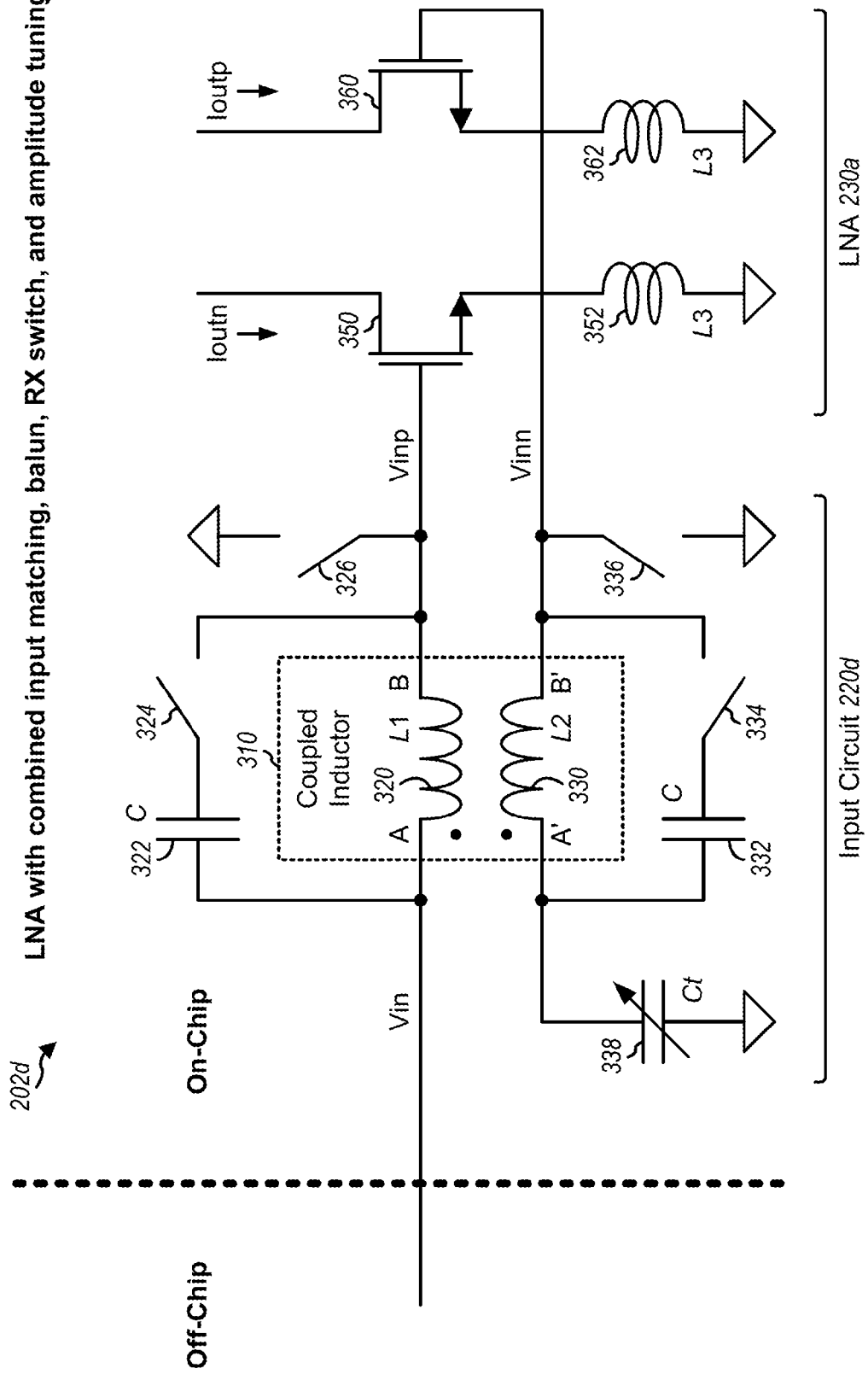

FIG. 6 shows a schematic diagram of an exemplary design of a front-end 202d comprising an LNA with combined input matching, balun, RX switch, and amplitude balance tuning. Front-end 202d comprises an input circuit 220d, which is another exemplary design of input circuit 220 in FIG. 2, and LNA 230a. In the exemplary design shown in FIG. 6, input circuit 220d comprises coupled inductor 310 and tuning capacitor 338, which are coupled as described above for FIG. 4. Input circuit 220d further comprises a capacitor 322 and a switch 324 coupled in series, the combination of which is coupled in parallel with coil 320 at nodes A and B. A capacitor 332 and a switch 334 are coupled in series, the combination of which is coupled in parallel with coil 330 at nodes A' and B'. A switch 326 is coupled between node B and circuit ground. A switch 336 is coupled between node B' and circuit ground. Switches 324, 326, 334 and 336 may each be implemented with an NMOS transistor and/or a P-channel MOS (PMOS) transistor. A switch may be closed by turning on the NMOS and/or PMOS transistor and may be opened by turning off the transistor.

Coil 320 and capacitor 322 form a first resonant circuit that resonates at a frequency of $f_{res1}$ when switch 324 is closed. Coil 330 and capacitor 332 form a second resonant circuit that resonates at a frequency Of $f_{res2}$ when switch 334 is closed. The resonant frequency $f_{res1}$ may be expressed as:

$$f_{res1} = \frac{1}{2\pi\sqrt{L_1 C}},\qquad\text{Eq (3)}$$

where C is the capacitance of capacitor 322. The resonant frequency $f_{res2}$ may be determined based on $L_2$ and C in similar manner.

The receiver may be operated in an ON state or an OFF state. In the ON state, switches 324, 326, 334 and 336 are opened. Capacitors 322 and 332 are decoupled from coils 320 and 330, respectively. Input circuit 220d would then be equivalent to input circuit 220b in FIG. 4.

In the OFF state, switches 324, 326, 334 and 336 are closed. Capacitor 322 is coupled to coil 320, and the first resonant circuit has a high input impedance at node A. Similarly, capacitor 332 is coupled to coil 330, and the second resonant circuit has a high input impedance at node A'. Ideally, the input impedance looking into nodes A and A' should be infinity at the operating frequency of LNA 230a due to the parallel resonant of coil 320 and capacitor 322 and also the parallel resonant of coil 330 and capacitor 332. The Q of coils 320 and 330 and the on resistance of switches 324 and 334 may limit the input impedance at nodes A and A'. Switches 326 and 336 ground the inputs of LNA 230a as well as nodes B and B' of the two resonator circuits.

Input circuit 220d includes an RX switch for the receiver. The RX switch is implemented with two resonator circuits that are enabled in the OFF state of the receiver. The receiver may have good linearity since no series switches are present in the signal paths from node X to the inputs of LNA 230a. Switches 324, 326, 334 and 336 are not located in the signal paths, are opened and turned off when the receiver is in the ON state, and minimally degrade linearity (if at all) when disabled. The switches are closed and turned on when the receiver is in the OFF state and hence have no impact to the receiver.

Figure 7:
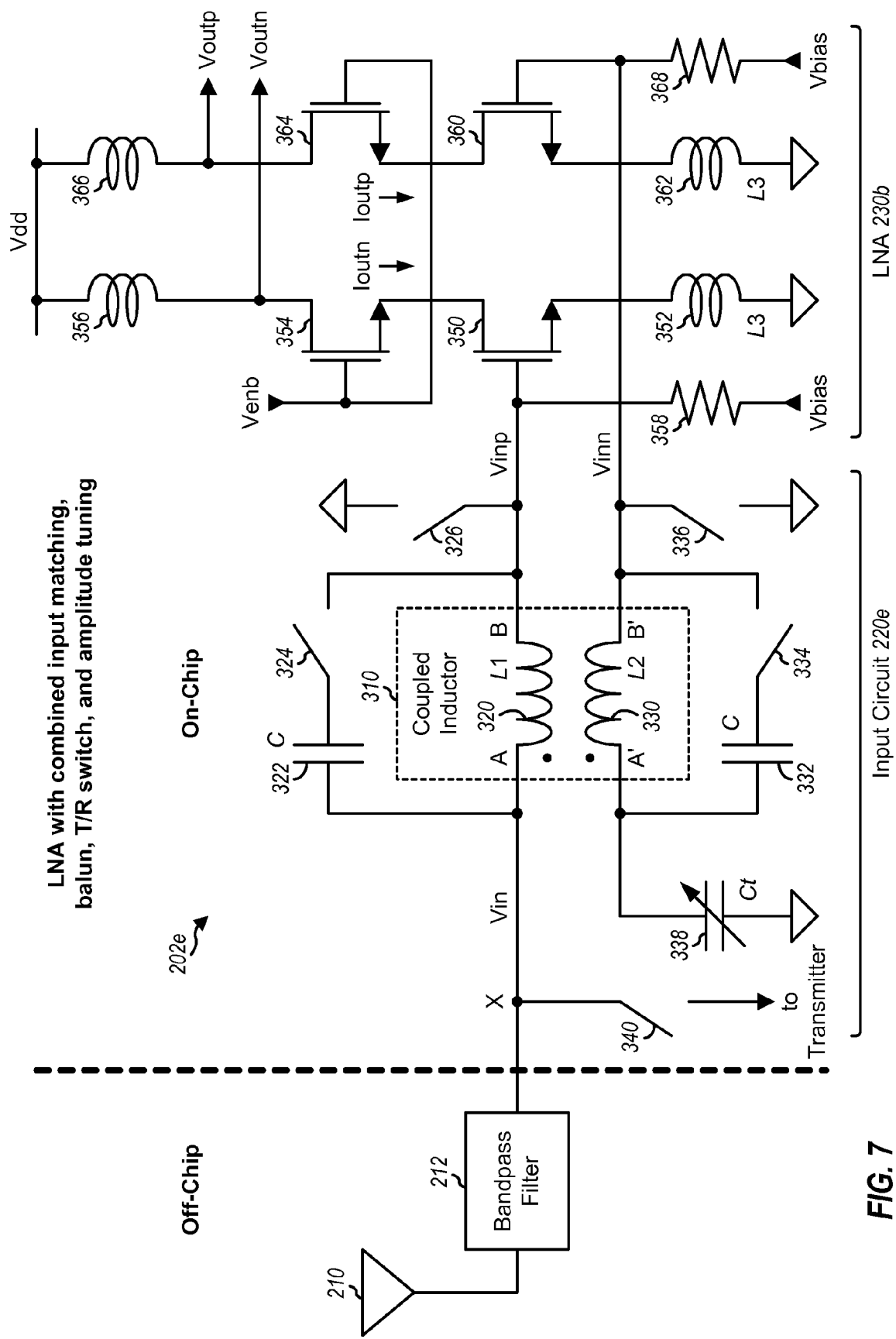

FIG. 7 shows a schematic diagram of an exemplary design of a front-end 202e comprising an LNA with combined input matching, balun, T/R switch, and amplitude balance tuning. Front-end 202e comprises an input circuit 220e and an LNA 230b, which are another exemplary design of input circuit 220 and LNA 230, respectively, in FIG. 2. Input circuit 220e includes all of the circuit components in input circuit 220d in FIG. 6. Input circuit 220e further includes a switch 340 having one input coupled to node X and the other end coupled to the transmitter. Node X further couples to bandpass filter 212, which further couples to antenna 210.

LNA 230b includes NMOS transistors 350 and 360 and inductors 352 and 362, which are coupled as described above for FIG. 3. LNA 230b further includes NMOS transistors 354 and 364 and inductors 356 and 366. NMOS transistor 354 has its source coupled to the drain of NMOS transistor 350, its gate receiving an enable voltage, Venb, and its drain providing the inverting output RF signal, Voutn. NMOS transistor 364 has its source coupled to the drain of NMOS transistor 360, its gate receiving the Venb voltage, and its drain providing the non-inverting output RF signal, Voutp. Inductors 356 and 366 are coupled between a power supply voltage, Vdd, and the drains of NMOS transistors 354 and 364, respectively. Resistors 358 and 368 have one end receiving a bias voltage, Vbias, and the other end coupled to the gates of NMOS transistors 350 and 360, respectively.

Within LNA 230b, NMOS transistors 350 and 360 are gain transistors that provide amplification for the Vinp and Vinn signals. NMOS transistors 354 and 364 are cascode transistors that provide buffering for the gain transistors and further provide signal drive for the Voutp and Voutn signals. Inductors 356 and 366 are load inductors that also provide output impedance matching for LNA 230b. LNA 230b may be enabled by turning on NMOS transistors 354 and 364 with a high Venb voltage (e.g., Vdd) and turning on NMOS transistors 350 and 360 via the Vbias voltage. LNA 230b may be disabled by turning off NMOS transistors 354 and 364 with a low Venb voltage (e.g., ground) and turning off NMOS transistors 350 and 360 by grounding their gates via switches 326 and 336.

Front-end 202e may operate in the transmit mode or the receive mode at any given moment. In the transmit mode, switches 324, 326, 334, 336 and 340 are all closed. The transmitter is coupled via switch 340 to node X. The two resonant circuits are enabled with switches 324 and 334 closed, and high input impedance is obtained looking into nodes A and A'. In the receive mode, switches 324, 326, 334, 336 and 340 are all opened. The transmitter is decoupled from node X by switch 340. The two resonant circuits are disabled with switches 324 and 334 opened, and the Vin signal is provided via coupled inductor 310 to the inputs of LNA 230b. The T/R switch may thus be implemented by switch 340, the two resonator circuits that may be enabled or disabled by switches 324 and 334, and shunt switches 326 and 336.

In the transmit mode, the transmitter may provide the transmit RF signal having a large amplitude. Switch 340 may be designed to handle the large signal amplitude and to have low insertion loss. The resonator circuits formed by coils 320 and 330 and capacitors 322 and 332 provide high input impedance in the transmit mode. Hence, the signal swing across switches 324, 326, 334 and 336 may be relatively small. These switches may be designed to provide good RF performance.

Figure 8:
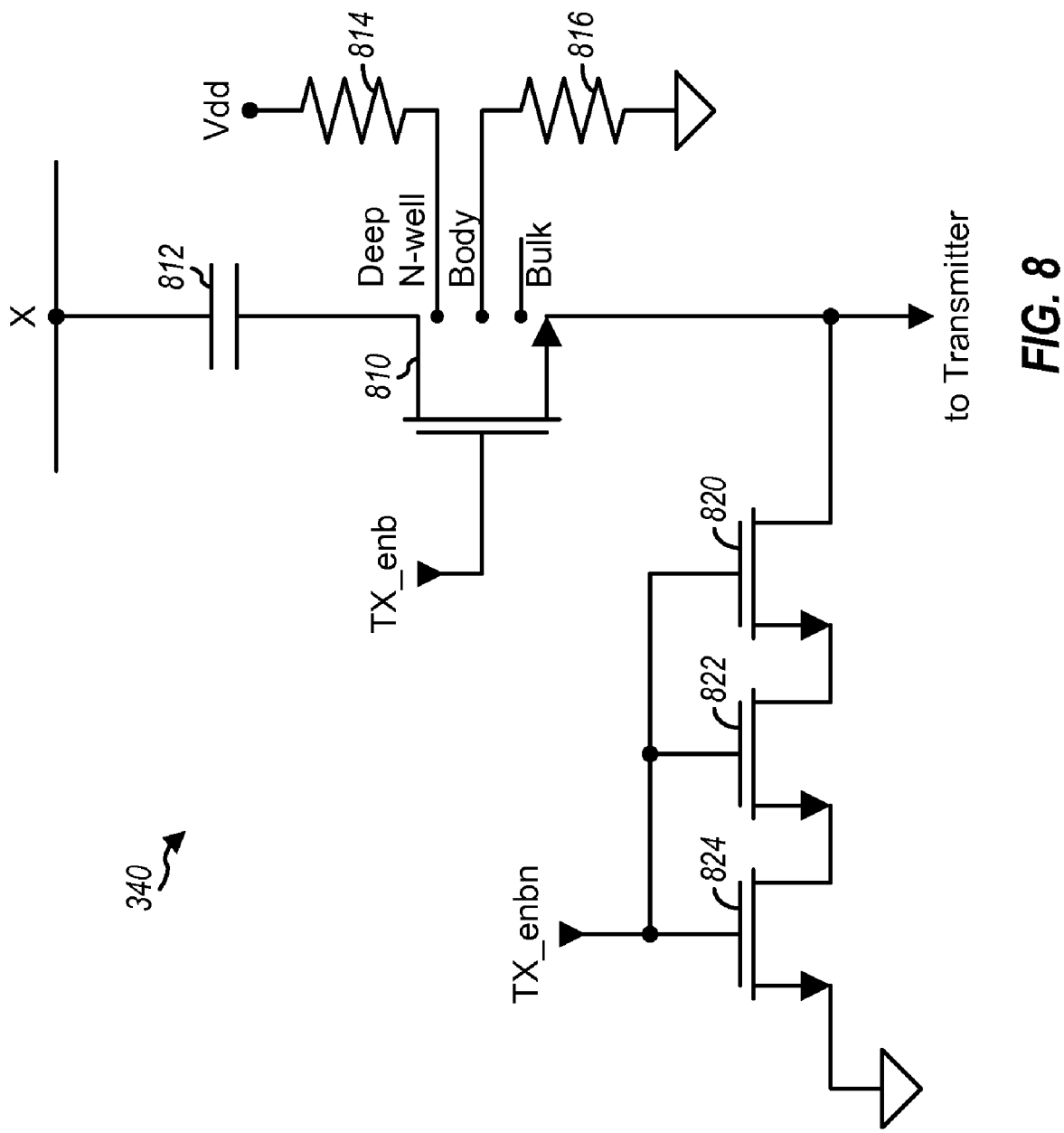
FIG. 8 shows an exemplary design of a transmit switch.

FIG. 8 shows an exemplary design of switch 340 for the transmitter in FIG. 7. In this exemplary design, an NMOS transistor 810 has its source coupled to the transmitter, its gate receiving a transmitter enable signal, TX_enb, and its drain coupled to one end of a capacitor 812. The other end of capacitor 812 is coupled to node X. NMOS transistor 810 may be implemented with a deep N-well transistor and may have its deep N-well coupled to the Vdd supply voltage via a resistor 814, its body coupled to circuit ground via a resistor 816, and its bulk floating. This configuration may allow NMOS transistor 810 to handle a large signal swing and to have lower series resistance and lower insertion loss when turned on.

NMOS transistors 820, 822 and 824 are coupled in a stacked configuration and have their gates receiving an inverted transmit enable signal, TX_enbn. NMOS transistor 820 has its drain coupled to the source of NMOS transistor 810 and its source coupled to the drain of NMOS transistor 822. NMOS transistor 824 has its drain coupled to the source of NMOS transistor 822 and its source coupled to circuit ground.

In the transmit mode, NMOS transistor 810 is turned on by the TX_enb signal, and NMOS transistors 820, 822 and 824 are turned off by the TX_enbn signal. The transmit RF signal from the transmitter is then passed through NMOS transistor 810 and via AC coupling capacitor 812 to node X. In the receive mode, NMOS transistor 810 is turned off by the TX_enb signal, and NMOS transistors 820, 822 and 824 are turned on by the TX_enbn signal. NMOS transistor 810 blocks the transmit RF signal from the transmitter. NMOS transistors 820, 822 and 824 shunt leakage signal from node X to circuit ground in the receive mode, which may provide more isolation from node X to the transmitter. The three NMOS transistors stacked in series can better handle a large signal in the transmit mode. Each NMOS transistor may then observe only a fraction of the large signal swing, which may improve reliability.

Figure 9:
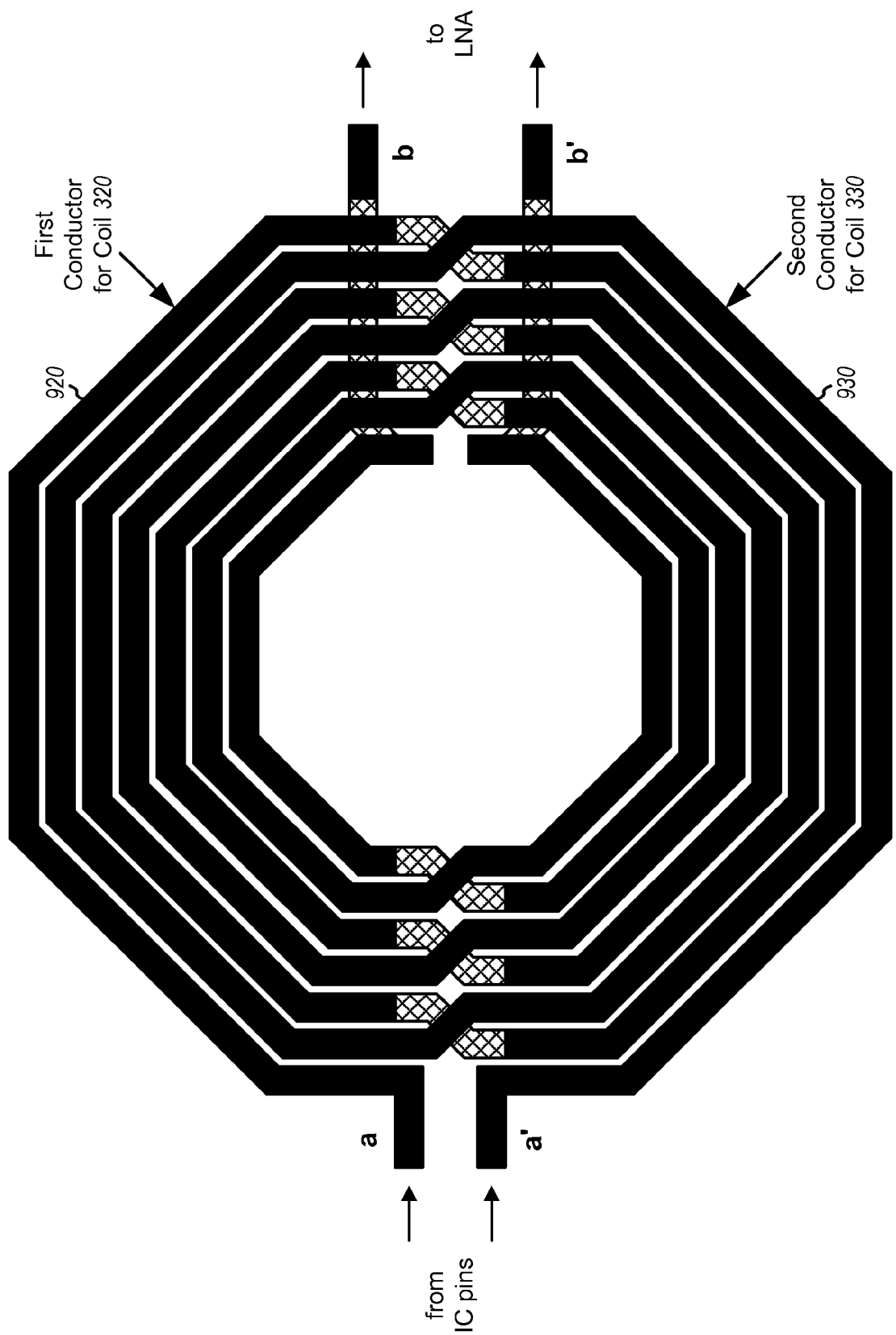
FIG. 9 shows an exemplary design of a coupled inductor.

FIG. 9 shows an exemplary design of coupled inductor 310 in FIGS. 3 through 7. In this exemplary design, coil 320 is implemented with a first conductor 920 having two end ports a and b, which correspond to nodes A and B, respectively, of coil 320. Coil 330 is implemented with a second conductor 930 having two end ports a' and b', which correspond to nodes A' and B', respectively, of coil 330. In the exemplary design shown in FIG. 9, the two conductors 920 and 930 are arranged in a spiral pattern and have a total of seven turns. In general, the number of turns, the diameter of the turns, the width and height of each conductor, the spacing between the two conductors, and/or other attributes of the two conductors may be selected to obtain the desired inductance and Q for each coil and the desired coupling coefficient between the two coils. The coupling coefficient may be varied by controlling the placement of conductors 920 and 930 and/or the distance between the conductors. Conductors 920 and 930 may also be shielded, e.g., with a guard ring around the outermost turn and/or a ground plane underneath the conductors (not shown in FIG. 9).

FIG. 9 shows an exemplary design of coupled inductor 310 with a spiral pattern. Coupled inductor 310 may also be implemented in other manners. For example, conductors 920 and 930 for coils 320 and 330 may be arranged in a double spiral, zig-zag, or some other pattern.

Conductors 920 and 930 may be fabricated with various types of conductive material such as a low-loss metal (e.g., copper), a more lossy metal (e.g., aluminum), or some other material. Higher Q may be achieved if conductors 920 and 930 are fabricated mostly or entirely on a low-loss metal layer, except for any underpass to interconnect sections of the same conductor. A smaller-size inductor may be fabricated on a lossy metal layer because different design rules may apply. Conductors 920 and 930 may be fabricated on the same layer (as shown in FIG. 9) or on different layers, e.g., to obtain stacked inductors. Different layouts and fabrication techniques (including Micro-Electro-Mechanical Systems (MEMS) technologies) may provide different advantages for the coupled inductor.

In general, an apparatus may comprise a coupled inductor and an LNA. The coupled inductor may receive a single-ended input signal, perform single-ended to differential conversion, and provide a differential input signal. The LNA may be coupled to the coupled inductor, may receive and amplify the differential input signal, and may provide a differential output signal. The coupled inductor and the LNA may be implemented on an IC.

In an exemplary design, the coupled inductor may comprise a first coil (e.g., coil 320) magnetically coupled with a second coil (e.g., coil 330). The first coil may receive the single-ended input signal and provide a first input signal to the LNA. The second coil may provide a second input signal to the LNA. The differential input signal may comprise the first and second input signals.

In an exemplary design, a first capacitor (e.g., capacitor 322) and a first switch (e.g., switch 324) may be coupled in series and further in parallel with the first coil. The first capacitor and the first coil may form a first resonant circuit when the first switch is closed. A second capacitor (e.g., capacitor 332) and a second switch (e.g., 334) may be coupled in series and further in parallel with the second coil. The second capacitor and the second coil may form a second resonant circuit when the second switch is closed. The first coil may provide input impedance matching when the LNA is enabled. The first resonator circuit may provide high input impedance when the LNA is disabled. The first and second resonant circuits may resonate at or near the operating frequency of the LNA. The first and second coils may be implemented with first and second conductors, respectively, which may be arranged in a spiral pattern (e.g., as shown in FIG. 9) or some other pattern.

In an exemplary design, a third switch (e.g., switch 326) may have a first end coupled to the first switch and the first coil and a second end coupled to circuit ground. A fourth switch (e.g., switch 336) may have a first end coupled to the second switch and the second coil and a second end coupled to circuit ground. The third and fourth switches may be opened when the LNA is enabled and may be closed when the LNA is disabled.

In an exemplary design, a tuning capacitor (e.g., capacitor 338) may be coupled to the second coil and may provide amplitude imbalance tuning for the differential input signal. The tuning capacitor may comprise a bank of selectable capacitors, with each selectable capacitor being enabled or disabled to vary the capacitance of the tuning capacitor. The tuning capacitor may also be implemented with one or more varactors, one or more fixed capacitors, etc.

In an exemplary design, a switch (e.g., switch 340) may be coupled between the first coil and a transmitter. The switch may be closed in a transmit mode and opened in a receive mode.

In an exemplary design, the LNA may comprise first and second transistors and first and second inductors. The first transistor may receive and amplify the first input signal. The second transistor may receive and amplify the second input signal. The first and second inductors may be coupled between the sources of the first and second transistors, respectively, and circuit ground. The LNA may further comprise third and fourth transistors and third and fourth inductors. The third transistor may be coupled to the first transistor and may provide a first output signal. The fourth transistor may be coupled to the second transistor and may provide a second output signal. The differential output signal may comprise the first and second output signals. The third and fourth inductors may be coupled between the drains of the third and fourth transistors, respectively, and a supply voltage.

In an exemplary design, a bandpass filter may receive a signal from an antenna and provide the single-ended input signal to the coupled inductor. The bandpass filter may be external to the IC comprising the coupled inductor and the LNA. Other circuit blocks may also be coupled between the antenna and the coupled inductor.

Figure 10:
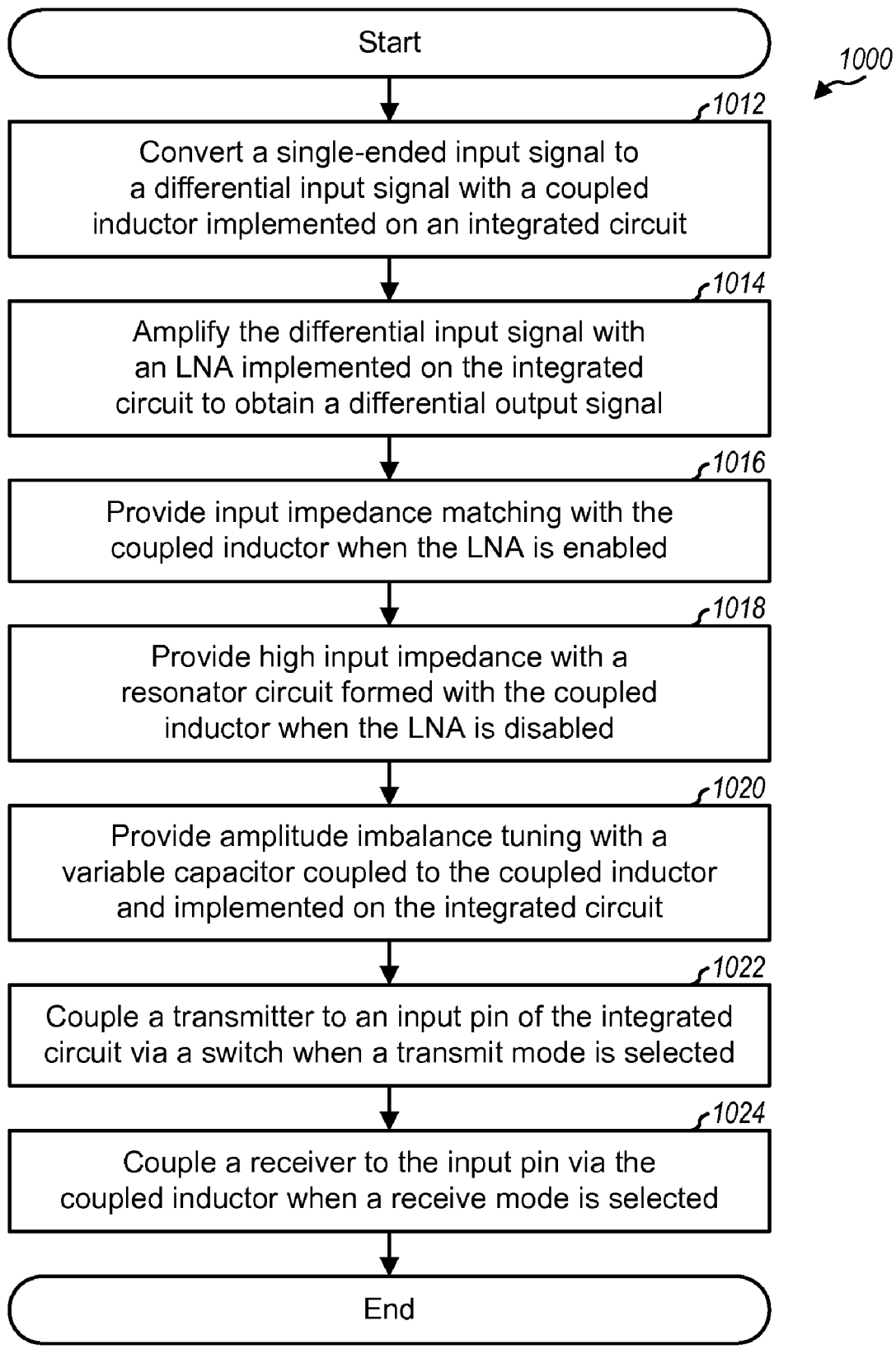
FIG. 10 shows an exemplary design of a process for conditioning a signal.

FIG. 10 shows an exemplary design of a process 1000 for conditioning a signal. A single-ended input signal may be converted to a differential input signal with a coupled inductor implemented on an IC (block 1012). The differential input signal may be amplified with an LNA implemented on the IC to obtain a differential output signal (block 1014). Input impedance matching may be provided with the coupled inductor when the LNA is enabled (block 1016). High input impedance may be provided with a resonator circuit formed with the coupled inductor when the LNA is disabled (block 1018). Amplitude imbalance tuning may be provided with a variable capacitor coupled to the coupled inductor and implemented on the integrated circuit (block 1020). A transmitter may be coupled to an input pin of the IC via a switch when a transmit mode is selected (block 1022). A receiver may be coupled to the input pin via the coupled inductor when a receive mode is selected (block 1024).

The LNA with combined input matching, balun, and/or T/R switch described herein may provide various advantages. A T/R switch may be implemented on-chip and may avoid the use of additional off-chip circuit components. Tunable input matching may be achieved for the combined balun and T/R switch via on-chip tuning capacitor 338. The tunable input matching may provide flexibility to enhance performance without using off-chip components. Improved electro-static discharge (ESD) performance may also be achieved, especially for a charged device model (CDM) test, due to large input impedance at high frequency with the resonator circuits. Improved noise and gain performance may also be obtained due to the T/R switch being implemented with the resonator circuits and having low insertion loss when turned on. Improved linearity may also be obtained due to switches 324, 326, 334 and 336 being turned off (instead of on) in the receive mode.

The LNA with combined input matching, balun, and/or T/R switch described herein may be used in various systems and applications such as communication, networking, computing, consumer electronics, etc. For example, the LNA may be used for various wireless communication systems such as Code Division Multiple Access (CDMA), Time Division Multiple Access (TDMA), Frequency Division Multiple Access (FDMA), Orthogonal FDMA (OFDMA), Single-Carrier FDMA (SC-FDMA) and other systems. The LNA may also be used for wireless wide area networks (WWANs), wireless local area networks (WLANs), wireless personal area networks (WPANs), etc. The LNA may also be used for Global Positioning System (GPS) receivers, broadcast receivers, etc. The LNA may also be used for various radio technologies such as Global System for Mobile Communications (GSM), Wideband CDMA (WCDMA), cdma2000, Long Term Evolution (LTE), Advanced Mobile Phone System (AMPS), IEEE 802.11 (WiFi), IEEE 802.16 (WiMax), Bluetooth, etc. The LNA may also be used at various operating frequencies. The inductors and capacitors may be designed for the selected operating frequency.

The LNA with combined input matching, balun, and/or T/R switch described herein may be implemented on an IC, an analog IC, an RFIC, a mixed-signal IC, an application specific integrated circuit (ASIC), etc. The LNA may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the LNA described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a coupled inductor configured to receive a single-ended input signal, to perform single-ended to differential conversion, and to generate a differential input signal at least in part by conductively coupling the single-ended input signal to an input signal of the differential input signal; and
   a low noise amplifier (LNA) coupled to the coupled inductor and configured to receive the differential input signal and to generate a differential output signal.

2. The apparatus of claim 1, the coupled inductor and the LNA being implemented on an integrated circuit.

3. The apparatus of claim 1, the coupled inductor comprising a first coil magnetically coupled with a second coil, the first coil configured to receive the single-ended input signal and to generate a first input signal to the LNA, the second coil to generate a second input signal to the LNA, and the differential input signal comprising the first and second input signals.

4. The apparatus of claim 3, further comprising:
   a first capacitor and a first switch coupled in series and further in parallel with the first coil, the first capacitor and the first coil forming a first resonant circuit when the first switch is closed; and
   a second capacitor and a second switch coupled in series and further in parallel with the second coil, the second capacitor and the second coil forming a second resonant circuit when the second switch is closed.

5. The apparatus of claim 4, the first coil configured to generate input impedance matching when the LNA is enabled, and the first resonator circuit configured to generate high input impedance when the LNA is disabled.

6. The apparatus of claim 4, the first and second resonant circuits configured to resonate at an operating frequency of the LNA.

7. The apparatus of claim 4, further comprising:
   a third switch having a first end coupled to the first switch and the first coil and a second end coupled to circuit ground; and
   a fourth switch having a first end coupled to the second switch and the second coil and a second end coupled to circuit ground, the third and fourth switches being opened when the LNA is enabled and closed when the LNA is disabled.

8. The apparatus of claim 3, further comprising:
   a tuning capacitor coupled to the second coil and configured to generate amplitude imbalance tuning for the differential input signal.

9. The apparatus of claim 8, the tuning capacitor comprising a bank of selectable capacitors, each selectable capacitor being enabled or disabled to vary capacitance of the tuning capacitor.

10. The apparatus of claim 3, further comprising:
    a switch coupled between the first coil and a transmitter, the switch being closed in a transmit mode and opened in a receive mode.

11. The apparatus of claim 3, the first and second coils being implemented with first and second conductors, respectively, arranged in a spiral pattern.

12. The apparatus of claim 1, the LNA comprising:
    a first transistor configured to receive and to amplify a first input signal,
    a second transistor configured to receive and to amplify a second input signal, the differential input signal comprising the first and second input signals,
    a first inductor coupled between a source of the first transistor and circuit ground, and
    a second inductor coupled between a source of the second transistor and circuit ground.

13. The apparatus of claim 12, the LNA further comprising:
    a third transistor coupled to the first transistor and configured to generate a first output signal,
    a fourth transistor coupled to the second transistor and configured to generate a second output signal, the differential output signal comprising the first and second output signals,
    a third inductor coupled between a drain of the third transistor and a supply voltage, and
    a fourth inductor coupled between a drain of the fourth transistor and the supply voltage.

14. The apparatus of claim 2, further comprising:
    a bandpass filter configured to receive a signal from an antenna and to generate the single-ended input signal, the bandpass filter being external to the integrated circuit.

15. An integrated circuit comprising:
    a coupled inductor configured to receive a single-ended input signal, to perform single-ended to differential conversion, and to generate a differential input signal at least in part by conductively coupling the single-ended input signal to an input signal of the differential input signal; and
    a low noise amplifier (LNA) coupled to the coupled inductor and configured to receive the differential input signal and to generate a differential output signal.

16. The integrated circuit of claim 15, the coupled inductor comprising:
    a first coil magnetically coupled with a second coil, the first coil configured to receive the single-ended input signal and to generate a first input signal to the LNA, the second coil configured to generate a second input signal to the LNA, and the differential input signal comprising the first and second input signals.

17. The integrated circuit of claim 16, further comprising:
a first capacitor and a first switch coupled in series and further in parallel with the first coil, the first capacitor and the first coil forming a first resonant circuit when the first switch is closed; and
a second capacitor and a second switch coupled in series and further in parallel with the second coil, the second capacitor and the second coil forming a second resonant circuit when the second switch is closed.

18. The integrated circuit of claim 16, further comprising:
a tuning capacitor coupled to the second coil and configured to generate amplitude imbalance tuning for the differential input signal.

19. The integrated circuit of claim 16, further comprising:
a switch coupled between the first coil and a transmitter, the switch being closed in a transmit mode and opened in a receive mode.

20. A method comprising:
converting a single-ended input signal to a differential input signal at least in part by conductively coupling the single-ended input signal to an input signal of the differential input signal with a coupled inductor implemented on an integrated circuit; and
amplifying the differential input signal with a low noise amplifier (LNA) implemented on the integrated circuit to obtain a differential output signal.

21. The method of claim 20, further comprising:
providing input impedance matching with the coupled inductor when the LNA is enabled; and
providing high input impedance with a resonator circuit formed with the coupled inductor when the LNA is disabled.

22. The method of claim 20, further comprising:
providing amplitude imbalance tuning with a variable capacitor coupled to the coupled inductor and implemented on the integrated circuit.

23. The method of claim 20, further comprising:
coupling a transmitter to an input pin of the integrated circuit via a switch when a transmit mode is selected; and
coupling a receiver to the input pin via the coupled inductor when a receive mode is selected.

24. An apparatus comprising:
means for converting a single-ended input signal to a differential input signal at least in part by conductively coupling the single-ended input signal to an input signal of the differential input signal with a coupled inductor implemented on an integrated circuit; and
means for amplifying the differential input signal with a low noise amplifier (LNA) implemented on the integrated circuit to obtain a differential output signal.

* * * * *